US010564213B2

(12) United States Patent
Huynh et al.

(10) Patent No.: US 10,564,213 B2
(45) Date of Patent: Feb. 18, 2020

(54) DIELECTRIC BREAKDOWN MONITOR

(71) Applicant: International Business Machines Corporation, Armonk, NY (US)

(72) Inventors: Tam N. Huynh, White Plains, NY (US); Keith A. Jenkins, Sleepy Hollow, NY (US); Franco Stellari, Waldwick, NJ (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 225 days.

(21) Appl. No.: 15/443,688

(22) Filed: Feb. 27, 2017

(65) Prior Publication Data
US 2018/0246159 A1 Aug. 30, 2018

(51) Int. Cl.
*G01R 31/12* (2006.01)
*G01R 31/14* (2006.01)
*G01R 31/30* (2006.01)
*H03K 3/03* (2006.01)

(52) U.S. Cl.
CPC ......... *G01R 31/129* (2013.01); *H03K 3/0315* (2013.01)

(58) Field of Classification Search
None
See application file for complete search history.

(56) References Cited

U.S. PATENT DOCUMENTS

| 5,304,859 A * | 4/1994 | Arimoto | ................. G05F 3/205 327/534 |
| 6,040,610 A * | 3/2000 | Noguchi | ............. H01L 21/8238 257/314 |
| 6,900,690 B2 * | 5/2005 | Kang | ..................... H03K 3/012 327/544 |
| 6,903,564 B1 | 6/2005 | Suzuki | |
| 6,933,744 B2 * | 8/2005 | Das | .................... H03K 19/0016 326/17 |
| 8,072,233 B2 | 12/2011 | Yach et al. | |
| 9,083,323 B2 | 7/2015 | Guo et al. | |
| 2005/0134394 A1 | 6/2005 | Liu | |

(Continued)

FOREIGN PATENT DOCUMENTS

WO    2010/038330 A1    4/2010

OTHER PUBLICATIONS

Lu et al., "Long-term NBTI Degradation Under Real-Use Conditions in IBM Microprocessors," *Microelectronics Reliability*, vol. 54 (2014), pp. 2371-2377.

*Primary Examiner* — Paresh Patel
(74) *Attorney, Agent, or Firm* — Intelletek Law Group, PLLC; Gabriel Daniel, Esq.

(57) ABSTRACT

A method and system of monitoring a reliability of a semiconductor circuit are provided. A current consumption of a first ring oscillator that is in static state is measured at predetermined intervals. Each measured current consumption value is stored. A baseline current consumption value of the first ring oscillator is determined based on the stored current consumption values. A latest measured current consumption value of the first ring oscillator is compared to the baseline current consumption value. Upon determining that the latest measured current consumption value is above a threshold deviation from the baseline current consumption value, the first ring oscillator is identified to have a dielectric breakdown degradation.

20 Claims, 9 Drawing Sheets

(56) References Cited

U.S. PATENT DOCUMENTS

| | | |
|---|---|---|
| 2005/0140418 A1 | 6/2005 | Muniandy et al. |
| 2007/0013452 A1 | 1/2007 | Bhushan et al. |
| 2010/0279500 A1 | 11/2010 | Han |
| 2011/0090015 A1 | 4/2011 | Sumita et al. |
| 2011/0173432 A1 | 7/2011 | Cher et al. |
| 2014/0022008 A1 | 1/2014 | Noorlag et al. |
| 2015/0074469 A1 | 3/2015 | Cher et al. |
| 2015/0294455 A1 | 10/2015 | Lee et al. |
| 2018/0248555 A1* | 8/2018 | Jenkins ................ H03K 3/0315 |
| 2018/0292879 A1* | 10/2018 | Cher .................... G06F 1/3206 |

\* cited by examiner

DIELECTRIC BREAKDOWN MONITOR

STATEMENT REGARDING FEDERALLY SPONSORED RESEARCH OR DEVELOPMENT

This application has been written with Government support under Contract No.: HR0011-16-C-0040 (Defense Advanced Research Projects Agency (DARPA)). The Government has certain rights in this invention.

BACKGROUND

Technical Field

The present disclosure generally relates to semiconductor devices, and more particularly, to systems and methods of determining the reliability degradation of a semiconductor circuit.

Description of the Related Art

The lifetime of a semiconductor circuit varies due to various environmental factors. As a semiconductor circuit ages, the performance of the transistors degrades, which ultimately may render the semiconductor circuit to be unreliable. The semiconductor circuit ages because its transistors are exposed to different operational conditions, such as current, voltage, temperature, etc. The cumulative effects of such stress reduce the effective age of the semiconductor circuit.

One such aging effect or degradation mechanism is bias-temperature instability (BTI), which is a reliability concern with field effect transistors (FET's). Under this effect, there is an increase in the threshold voltage of a transistor, and consequently, a decrease in drain current and transconductance of a FET. The degradation has a logarithmic dependence with time. While BTI affects both P-channel and N-channel metal oxide semiconductor (MOS) devices, it is typically more of a concern in P-channel MOS devices, since they usually operate with a negative gate to source bias. However, the same degradation also adversely affects NMOS transistors when biased in the accumulation regime.

Another degradation mechanism that affects semiconductor devices is hot carrier injection (HCI), where an electron gains sufficient kinetic energy to overcome a potential barrier to break an interface state of a FET. Since the charge carriers can become trapped in the gate dielectric of a MOS transistor, the switching characteristics of the transistor can be permanently changed.

Yet another degradation mechanism is electrical breakdown, sometimes referred to as dielectric breakdown (DB), which adversely affects a semiconductor device by reducing the resistance of an electrical insulator over time. Consequently, the insulator becomes conductive, causing the transistor to lose performance or even fail. The effects of BTI, HCI, and DB are collectively referred to herein as transistor degradation.

BTI and HCI affect all FETs at about the same rate over time. However, dielectric breakdown may occur over substantially different time scales. While BTI and HCI may increase the threshold voltage of the affected FETs, dielectric breakdown is subject to a different degradation mechanism. Dielectric breakdown may eventually lead to a leakage current that is so large that it effectively damages the dielectric and acts more like a short, ultimately leading to circuit failure.

SUMMARY

According to an embodiment of the present disclosure, a semiconductor reliability monitor is provided. There is a first ring oscillator maintained under a reference stress voltage while in a static state. There is a current sensor configured to measure a current consumption value of the first ring oscillator while the first ring oscillator is in the static state, wherein the current consumption measurement is performed at predetermined intervals. There is a controller coupled to the first ring oscillator. this controller is configured to perform various functions, including: receiving and storing each measured current consumption value of the first ring oscillator while in the static state, in a memory; determining a baseline current consumption value of the first ring oscillator based on the stored current consumption values; comparing a latest measured current consumption value of the first ring oscillator to the baseline current consumption value; and upon determining that the latest measured current consumption value is above a threshold deviation from the baseline current consumption value, identifying the first ring oscillator to have a dielectric breakdown.

In one embodiment, there is a second ring oscillator maintained without a reference stress voltage while in a static state. In this regard, the controller is further configured to activate an active state of the first and second ring oscillators for a predetermined time period; determine a frequency of oscillation of the first ring oscillator and the second ring oscillator during the predetermined time period; and upon determining that the frequency of oscillation of the first ring oscillator is below a threshold variation from the second ring oscillator, identifying the first ring oscillator to have a BTI and HCI degradation. The change over time of the frequency difference between the two ring oscillators may also be used to calculate/quantify the amount of degradation.

In one embodiment, there is a third ring oscillator maintained in a free running state and at the reference stress voltage. In this regard, the controller is further configured to activate an active state of the second ring oscillator for a predetermined time period; determine a frequency of oscillation of the second ring oscillator and the third ring oscillator, during the predetermined time period; and upon determining that the frequency of oscillation of the third ring oscillator is below a threshold variation from the second ring oscillator, identifying the third ring oscillator to have a BTI and HCI degradation.

According to another embodiment of the present disclosure, a method of monitoring a degradation of a semiconductor circuit is provided. A current consumption of a first ring oscillator that is in static state is measured at predetermined intervals. Each measured current consumption value is stored. A baseline current consumption value of the first ring oscillator is determined based on the stored current consumption values. A latest measured current consumption value of the first ring oscillator is compared to the baseline current consumption value. Upon determining that the latest measured current consumption value is above a threshold deviation from the baseline current consumption value, the first ring oscillator is identified to have a dielectric breakdown degradation. The difference in current between the ring oscillators may be used to quantify the degradation in performance.

In one embodiment, a second ring oscillator is maintained without a reference stress voltage while in a static state. An active state of the first and second ring oscillators is activated for a predetermined time period. A frequency of oscillation is determined of the first ring oscillator and the second ring oscillator during the predetermined time period. Upon determining that the frequency of oscillation of the first ring oscillator is below a threshold variation from the second ring oscillator, the first ring oscillator is identified to have a BTI and HCI degradation.

In one embodiment, a third ring oscillator is maintained in a free running state and at the reference stress voltage. An active state of the second ring oscillator is activated for a predetermined time period. The frequency of oscillation of the second ring oscillator and the third ring oscillator are determined, during the predetermined time period. Upon determining that the frequency of oscillation of the third ring oscillator is below a threshold variation from the second ring oscillator, the third ring oscillator is identified to have a BTI and HCI degradation.

BRIEF DESCRIPTION OF THE DRAWINGS

The drawings are of illustrative embodiments. They do not illustrate all embodiments. Other embodiments may be used in addition or instead. Details that may be apparent or unnecessary may be omitted to save space or for more effective illustration. Some embodiments may be practiced with additional components or steps and/or without all of the components or steps that are illustrated. When the same numeral appears in different drawings, it refers to the same or like components or steps.

DETAILED DESCRIPTION

Overview

In the following detailed description, numerous specific details are set forth by way of examples in order to provide a thorough understanding of the relevant teachings. However, it should be apparent that the present teachings may be practiced without such details. In other instances, well-known methods, procedures, components, and/or circuitry have been described at a relatively high-level, without detail, in order to avoid unnecessarily obscuring aspects of the present teachings.

Figure 1:
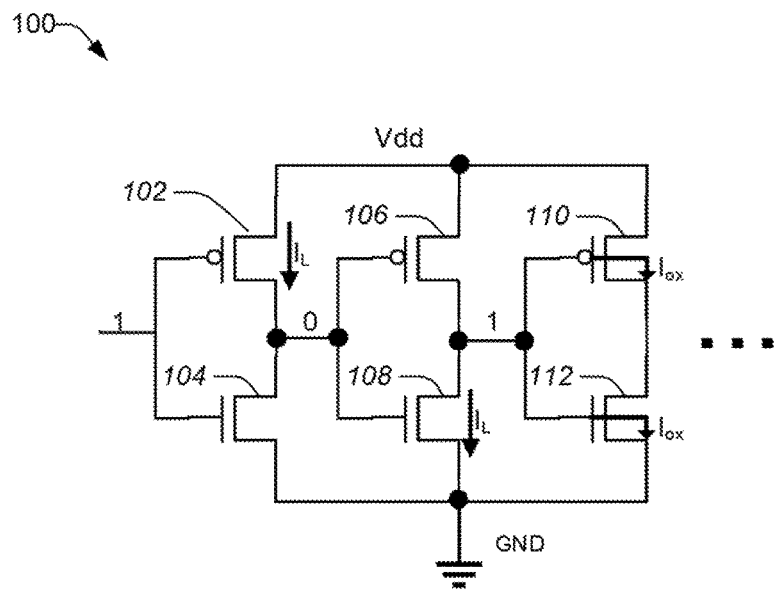
FIG. 1 illustrates an example circuit that can be affected by BTI, HCI, and dielectric breakdown degradation.

The present disclosure generally relates to semiconductor devices, and more particularly, to determining the status of degradation of semiconductor circuits due to different degradation mechanisms. The degradation mechanisms can be identified in different ways. In this regard, FIG. 1 illustrates an example circuit 100 that can be affected by BTI, HCI, and DB. Circuit 100 includes several inverters connected in series. When a high signal (i.e., "1") is applied to the gates of the first inverter, transistor 102 is OFF and transistor 104 is ON. Accordingly, in the second inverter, transistor 106 is ON while transistor 108 is OFF. Since the second inverter provides a high (i.e., "1") at its output, the transistor 110 is OFF while transistor 112 is ON.

In the example of circuit 100, the leakage in the first inverter is determined by the transistor 102 and the leakage in the second inverter is due to the leakage through the transistor 108. The effects of BTI and HCI raise the threshold voltages of the affected transistors (i.e., 102 to 108), thereby reducing the leakage current of the circuit 100. For example, the more degradation due to BTI and/or HCI, the longer it takes for a signal to propagate through the circuit 100. However, the early DB degradation does not affect frequency and therefore, involves a different approach. In BTI, there is an increase in leakage current from the gate, through the oxide, to the drain and/or source of the affected transistors (i.e., 110 and 112 in the example of FIG. 1).

Thus, the increase in threshold voltage due to BTI causes a decrease of the ordinary leakage (or standby) current (i.e., current from Vdd to ground through the drain and source terminals of the transistors 102 and 104 in the first inverter, and transistors 106 and 108 in the second inverter), which is in contrast to the net effects of DB, where the current is through the gate to source terminals and increases as a function of degradation. Thus, BTI contributes to a decrease in total standby leakage current, while DB contributes to an increase in total standby leakage current.

Figure 2:
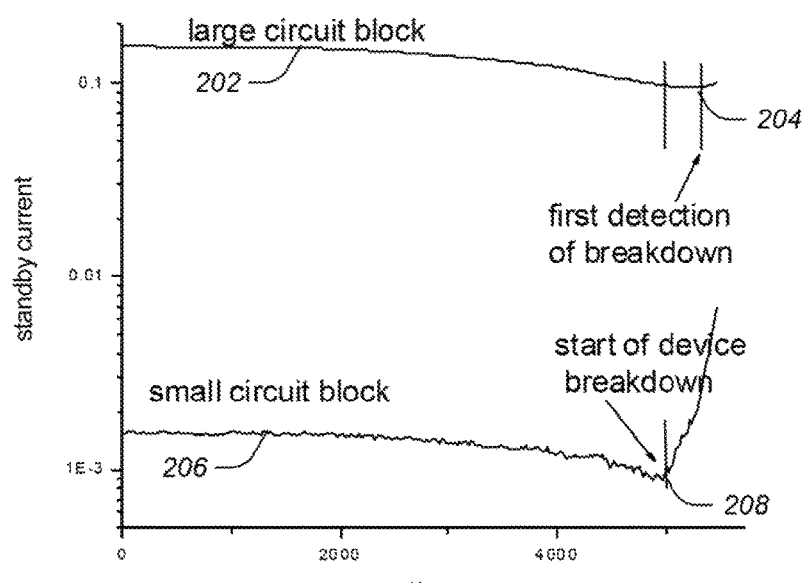
FIG. 2 illustrates an example graph of standby current for a large circuit block and for a small circuit block.

Reference now is made to FIG. 2, which illustrates an example graph of standby current for a large circuit block 202 and standby current for a small circuit block 206. The smaller the circuit block, the more readily the dielectric breakdown can be detected, as evidenced by the sharp rise in standby current upon device breakdown at point 208. However, the reality is that circuit blocks are typically large and may not be adequately represented by a small circuit block. To obtain a reliable account of the degradation of the transistors of a semiconductor circuit, using a larger circuit block is usually more accurate because it includes more components that may be subject to degradation, and the probability of overlooking degraded transistors is thereby reduced. While a large circuit block can indicate BTI, HCI, and DB degradation, in the presence of many devices degrading due to BTI and HCI, the first sign of early dielectric breakdown may not be seen, as illustrated by the more gradual increase in standby current at time 204 versus the more dramatic increase in standby current of the small circuit block at point 208.

Figure 3A:
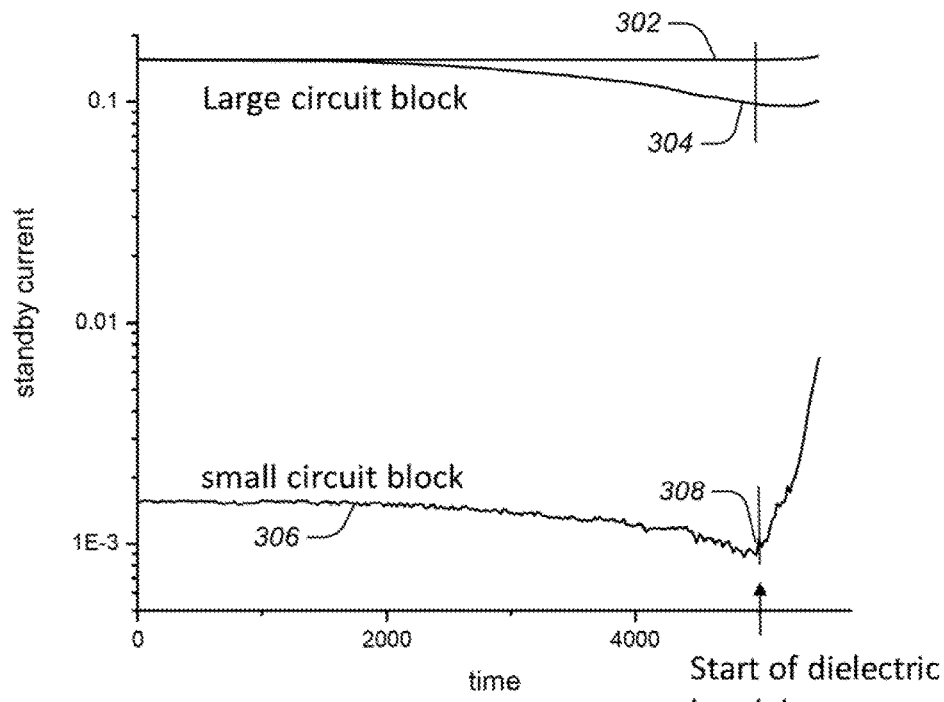
FIG. 3A illustrates an example graph of standby current for a large circuit block for a typically switched circuit and a typically static circuit, as well as standby current for a small circuit block.
Figure 3B:
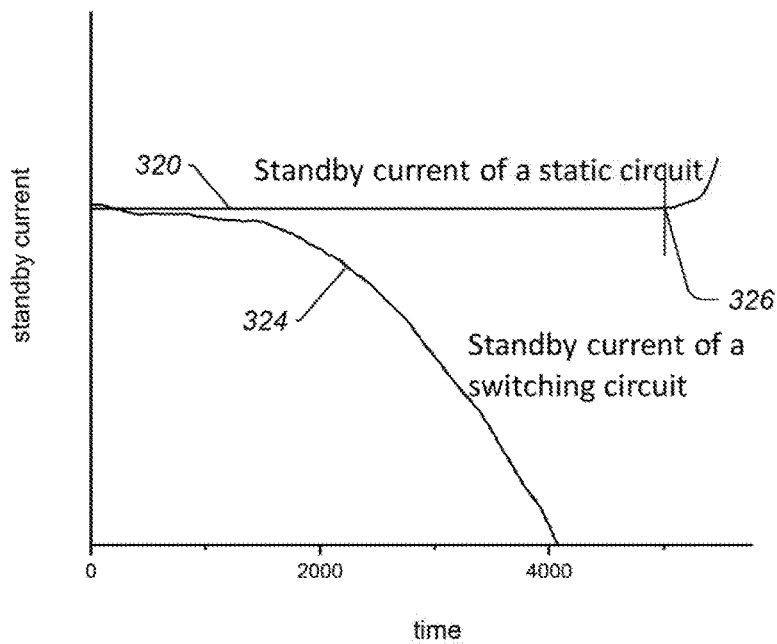
FIG. 3B illustrates a closer view of a portion of the graph of the large circuit block of FIG. 3A.

In one aspect, applicants have identified methods and systems of accurately determining dielectric breakdown in both small and large circuit blocks by virtue of performing the degradation analysis on a typically "static" circuit as compared to typically "active" circuits. In typically static circuits, the circuit may be subject to a bias voltage but is generally not switched. Rather, switching is only performed during a relatively short time period to determine a frequency of oscillation. In this regard, reference is made to FIG. 3A, which illustrates an example graph of standby current for a large circuit block for a typically active circuit 304 and a typically static circuit 302, as well as standby current for a small circuit block 306 having a dielectric breakdown at 308. As illustrated by waveform 304, the standby current goes down over time due to BTI and HCI degradation. However, to determine a dielectric breakdown, the static response 302 is more meaningful because it more clearly indicates a rise in leakage current, which is not offset by the degradation of BTI, and HCI due to switching. This effect is more clearly described in FIG. 3B, which illustrates a closer view of a portion of the graph of the large circuit block of FIG. 3A.

While the standby current of a typically switching circuit may still be degrading over time, as indicated by curve 324, performing the reliability analysis on the standby current of a static circuit provides more insight to the dielectric breakdown degradation of the circuit. For example, an increase in the standby current from a baseline 320 (e.g., between time 0 to 4500 in the example of FIG. 3B) is an indication of dielectric breakdown (i.e., at point 326 where the leakage current increases above a predetermined threshold with respect to the baseline of curve 320).

Figure 4:
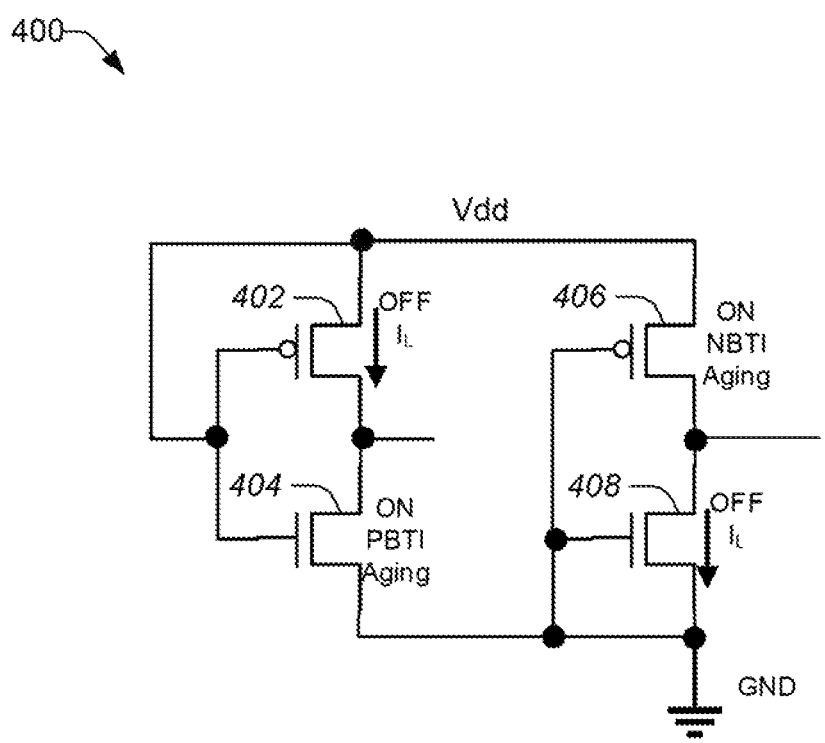
FIG. 4 illustrates two inverters that are held static at different potentials.

Accordingly, Applicants have identified that semiconductor transistors, which may be configured as an inverter, NAND gate, NOR gate, etc., degrade differently over time depending on the ON vs. OFF time of the corresponding transistor. This concept may be better understood in view of FIG. 4, which illustrates two inverters (402/404 and 406/408) that are held static at different potentials. For example, when the gates are "static" (i.e., not switching) BTI degrades the transistors that are ON, namely NFET transistor 404 and PFET 406 in the example of FIG. 4. However, the standby current is governed by the transistors that are OFF, namely PFET 402 and NFET 408, which are not subject to BTI degradation in the example static configuration of FIG. 4. Thus, the total standby current of circuit 400 does not change due to BTI degradation alone. Also, since circuit 400 is static, it is not subject to HCI degradation. For HCI degradation to affect a transistor, saturation current has to flow through it.

Example Architecture

Figure 5:
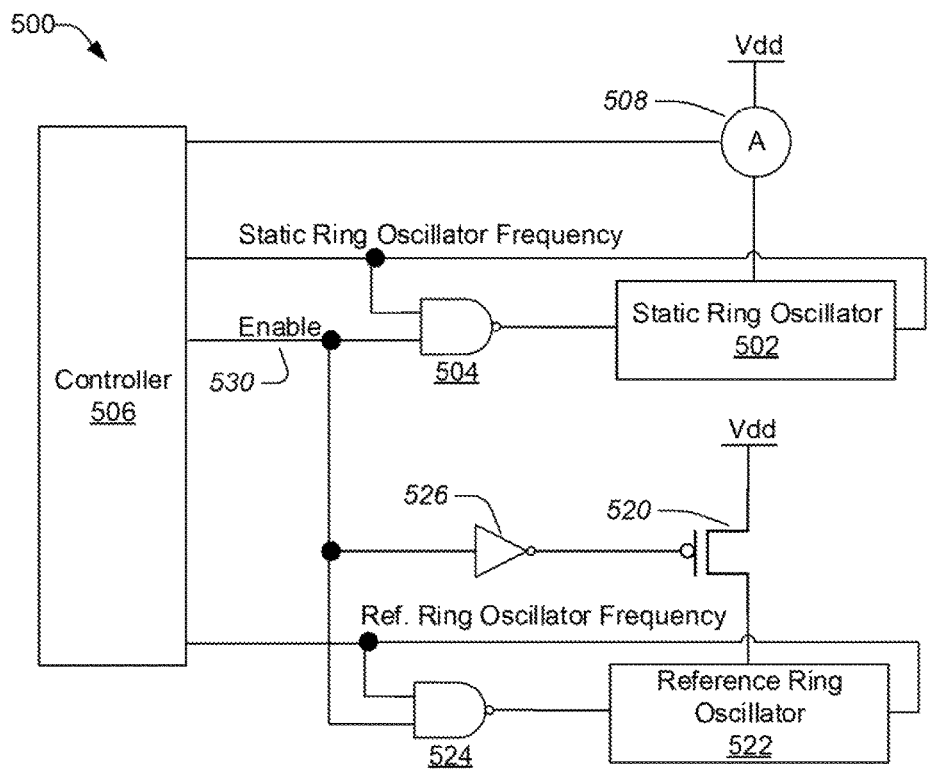
FIG. 5 is a block diagram of a system that can monitor the reliability of a semiconductor circuit, consistent with an illustrative embodiment.

FIG. 5 is a block diagram of a system 500 that can monitor the reliability of a semiconductor circuit (sometimes referred to herein as a semiconductor reliability monitor), consistent with an illustrative embodiment. The system 500 includes a first ring oscillator 502, which is operated at a reference voltage Vdd. The first ring oscillator 502 is referred to herein to be "static" because it typically does not switch, in order to better determine the dielectric breakdown degradation of the first ring oscillator 502. Exposure to the stress voltage Vdd while in static state is referred to herein as DC aging.

At predetermined intervals, the first ring oscillator 502 may be turned ON (i.e., allowed to switch) to determine the frequency of oscillation of the first ring oscillator. The ON time of the first ring oscillator is substantially less than its OFF time, thereby preventing the effects of HCI and BTI degradation in the first ring oscillator 502.

There is a current sensor 508 operative to measure a standby current of the first ring oscillator 502. The current measurement is performed when the first ring oscillator is static (i.e., not switching), which may be performed at predetermined intervals (e.g., once per day, every 100 hours of operation, etc.) or upon a trigger event. In various embodiments, the current sensor 508 may be a separate component or part of a controller 506, discussed in more detail later.

The controller 506, which may be implemented in hardware, software, or a combination thereof, is configured to turn ON (i.e., enable the switching) and OFF the first ring oscillator 502. As discussed previously, the controller 506 typically keeps the static ring oscillator in static state. For example, there is a logic gate 504 (e.g., NAND) that is operative to receive the enable signal from the controller 506 to facilitate the first ring oscillator to come out of the static state and enter an active (i.e., ON) state. The active state may be triggered by the controller 506 to determine the frequency of the first ring oscillator 502.

In one embodiment, there is a second ring oscillator 522, which is maintained in a static state without the reference voltage Vdd. Put differently, the second ring oscillator 522 is not under a voltage stress when it is not switching, and therefore completely OFF. In one embodiment, the actual structure of the first ring oscillator 502 and the second ring oscillator 522 is substantially similar. Thus, the type of transistors, their dimensions, number of stages, and configuration both in schematic and layout are substantially similar to provide a reliable comparison.

Instead of being directly coupled to the reference voltage Vdd, there is a transistor 520 (e.g., a PFET) which has a gate that is coupled via a buffer 526 to the enable signal of the controller 506. Similar to the first ring oscillator 502, the second ring oscillator 522, sometimes referred to herein as the reference ring oscillator, is coupled to a logic gate 524 (e.g., NAND) that is operative to receive the enable signal from the controller 506 to facilitate the reference ring oscillator 522 to come out of the static state and enter an active (i.e., ON) state, at predetermined intervals. The same enable signal may be used to provide the reference ring oscillator 522 the reference voltage Vdd in active state.

The controller 506 generally maintains both the first ring oscillator 502 and the reference ring oscillator 522 in a static state. In contrast to the first ring oscillator 502, the second ring oscillator is not operated under a reference stress voltage Vdd in static state. Rather, the reference voltage Vdd only is activated for a predetermined time period when the reference ring oscillator 522 is in active state, to measure the frequency of oscillation of the reference (i.e., second) ring oscillator 522. By virtue of using a reference ring oscillator 522, the frequency of the first ring oscillator 502 can be compared to a reference frequency (i.e., provided by the reference ring oscillator 522) to determine a deviation therefrom. For example, upon the controller 506 determining that the frequency of oscillation of the first ring oscillator 502 is below a predetermined threshold of the reference value, the first ring oscillator 502 is identified to have BTI degradation and HCI degradation.

While in the example of FIG. 5 the enable signal at node 530 is shared between the first ring oscillator 502 and the reference ring oscillator 522 (i.e., implying a concurrent frequency measurement), in one embodiment, each ring oscillator has its own separate enable signal from the controller. Put differently, the frequency of the first ring oscillator 502 can be measured at a time that is different from the frequency measurement of the reference ring oscillator 522. In this way, separate frequency measurement units are not required by the controller 506. Rather, the same frequency measurement unit can be used by the controller 506, thereby saving valuable real estate.

Notably, in system 500 the determination of the dielectric breakdown degradation is performed separately from BTI and HCI degradation. For example, when the enable signal at node 530 is "0" (i.e., the default state) the first ring oscillator 502 is in static state, and its current can be measured to identify dielectric breakdown degradation. At predetermined intervals, the enable signal is "1," thereby entering the active state of the first ring oscillator and the reference ring oscillator 522 to measure and later compare the switching speed of each oscillator, respectively. The frequency of oscillation of the first ring oscillator (e.g., in comparison to that of the reference ring oscillator 522) is used by the controller 506 to identify BTI and HCI degradation. By virtue of determining the dielectric breakdown degradation in static state, while the BTI and HCI degradation is performed in active state, the accuracy of the determination of the dielectric breakdown is significantly improved.

Figure 6:
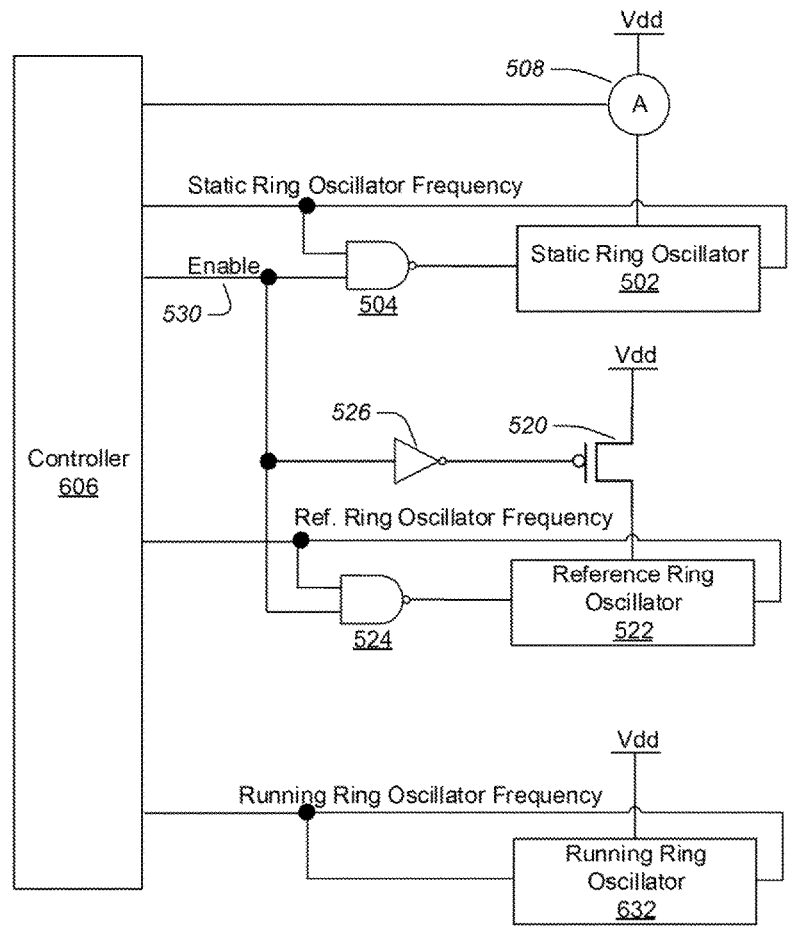
FIG. 6 is a block diagram of a reliability monitor system that includes a running ring oscillator, consistent with an illustrative embodiment.

Reference now is made to FIG. 6, which is a block diagram of a reliability monitor system 600 that includes a running ring oscillator, consistent with an illustrative embodiment. Some of the components of system 600 are substantially similar to those of system 500 and are therefore not repeated here for brevity. System 600 includes a third ring oscillator 632, sometimes referred to herein as a running ring oscillator, which is typically active and operated at a reference stress voltage Vdd. Since the running ring oscillator 632 is typically active, it is capable of revealing the effects of AC BTI and HCI aging.

For example, the controller 606 may activate the first ring oscillator 502 and/or the second ring oscillator 522 by providing a "1" as an enable signal at node 530. The oscillation frequency of the first ring oscillator 502 and/or the second ring oscillator 522 may be measured (e.g., concurrently or in sequence). The measured frequencies of the first ring oscillator 502 and/or the second ring oscillator 522 may be stored in a memory of the controller 606. In addition, the frequency of the running ring oscillator 632 is measured by the controller 606. In various embodiments, the frequencies of all three oscillators (i.e., 502 to 632) may be measured concurrently with separate frequency measurement units or in sequence with the same frequency measurement unit of the controller. The frequency of the running ring oscillator 632 is then compared to that of the first ring oscillator 502 and/or the second ring oscillator 522. For example, upon determining that the frequency of oscillation of the third ring oscillator is below a threshold variation from the second ring oscillator, the third ring oscillator is identified to have BTI and HCI degradation. In some embodiments (e.g., when a second ring oscillator 522 is not included), the frequency of the first ring oscillator is compared to that of the third oscillator 632 to perform a similar analysis.

Example Controller Device

Figure 7:
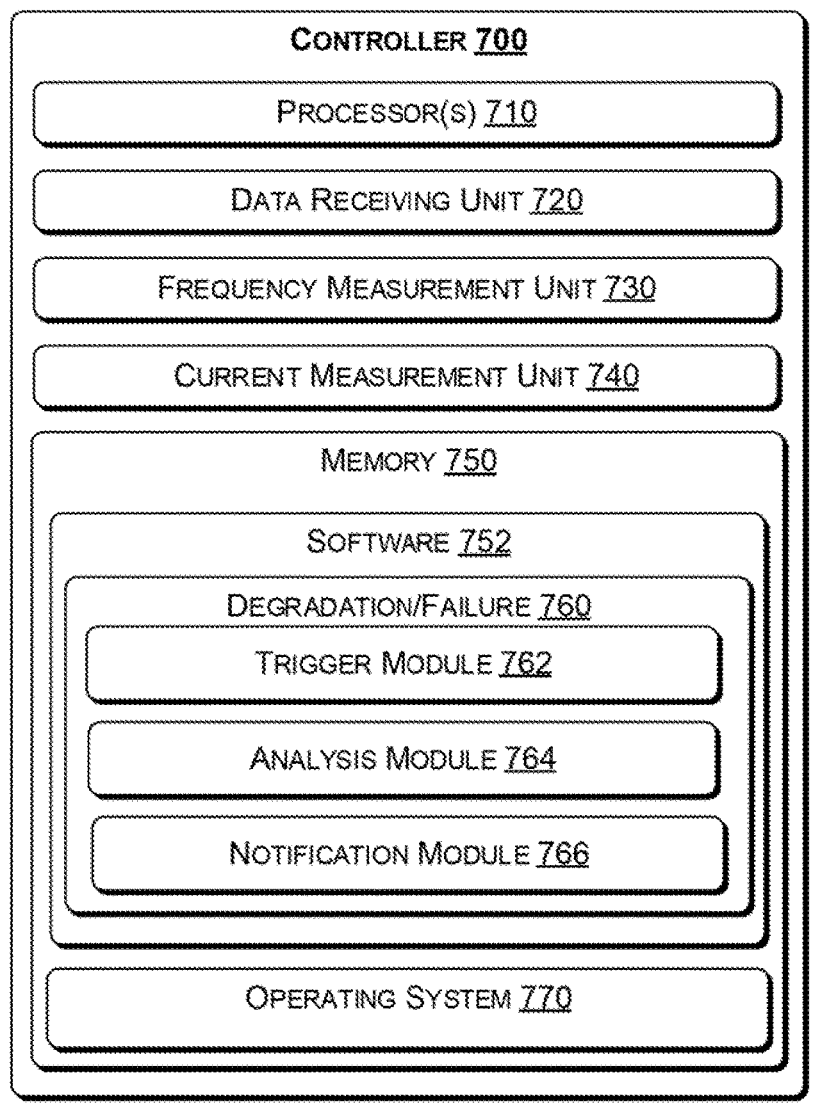
FIG. 7 illustrates a block diagram showing various components of an illustrative controller at a high level.

As discussed in the context of FIGS. 5 and 6, a semiconductor reliability monitor may include an appropriately configured controller to control the state of one or more ring oscillators and analyze the reliability thereof. To that end, FIG. 7 illustrates a block diagram showing various components of an illustrative controller 700 at a high level. For discussion purposes only, and not by way if limitation, the illustration shows the controller 700 to include various units and modules that have been divided between hardware and software. It will be understood that the listed functions can be performed by either software or hardware, or any reasonable combination thereof.

The controller 700 may include one or more processors 710, a data receiving unit 710, one or more frequency measurement units 730, a current measurement unit 740 memory 750 and an operating system 770. The one or more processors 710 may be a single-core processor, a multi-core processor, a complex instruction set computing (CISC) processor, or another type of processor.

The data receiving unit 720 is configured to receive information, including the standby current consumption of the first ring oscillator and the oscillation frequency of each oscillator under its control.

There may be one or more frequency measurement units 730 configured to determine the frequency of oscillation of the one or more ring oscillators when in active state. The frequency of oscillation of each ring oscillator may be determined at predetermined intervals or upon a trigger event. A trigger event may be a request to perform a reliability diagnostic of a semiconductor circuit that includes the one or more ring oscillators discussed herein.

As discussed previously, in various embodiments, the current measurement unit may be part of the controller 600 or outside thereof. The current measurement unit is configured to measure the standby current of the first ring oscillator 502 when in static state, at predetermined intervals or upon a trigger event.

The memory 750 may be implemented using computer-readable media, such as computer storage media. Storage media includes volatile and non-volatile, removable and non-removable media implemented in any method or technology for storage of information such as computer-readable instructions, data structures, program modules, or other data. Computer storage media includes, but is not limited to, RAM, ROM, EEPROM, flash memory or other memory technology, CD-ROM, digital versatile disks (DVD), high definition video storage disks, or other optical storage, magnetic cassettes, magnetic tape, magnetic disk storage or other magnetic storage devices, or any other non-transmission medium that can be used to store information for access by a computing device.

The memory 750 may store various software components or modules that are executable or accessible by the processor(s) 710 of the controller 700. In one embodiment, the memory 750 may be used to store the results of the current measurements of the static ring oscillator 502 over time to identify a baseline and a deviation therefrom. Additional information that may be stored includes, but is not limited to, the frequency of oscillation of one or more oscillators when in active state. The various components of the memory 750 may include software 752 and an operating system 770. The software 752 may include various applications 760, such as a degradation/failure application that is operative to determine the dielectric breakdown, HCI and BTI of a subject circuit. The degradation/failure application 760 may have several modules. Each module may include routines, program instructions, objects, and/or data structures that perform particular tasks or implement particular abstract data types. In some embodiments, some or all of the modules 762 to 766 are implemented in hardware instead of software, or in any combination thereof.

For example, the degradation/failure application 760 of the controller 700 may include a trigger module operative to enable/disable an active state of oscillators 502 and 522. The trigger module may also provide the timing (i.e., period and duration) of the active state of the oscillators 502 and 522. The trigger module may also provide the timing of the current measurements of the first ring oscillator 502 when in static state.

The degradation/failure application 760 may include an analysis module 764 that is operative to provide various functions, including identifying whether there is dielectric breakdown degradation in the first ring oscillator 502 by creating a baseline leakage current consumption when the ring oscillator is in static state and determining whether an increase in the baseline leakage current is above a predetermined threshold. The analysis module 764 is also operative to determine whether there is HCI and BTI degradation based on the frequency of oscillation of the first ring oscillator 502 compared to the second 522 and/or third ring oscillator 632.

The degradation/failure application 760 may include a notification module 766 configured to indicate whether there is a dielectric breakdown degradation, HCI degradation, and/or BTI degradation. In various embodiments, the alert may be provided in different ways. For example, the controller 506 or 606 may provide a binary output 0/1 for each reliability condition tested. In another example, a single output from the controller 506 or 606 indicates whether each condition tested is has passed (e.g., 0/1), via a single output that is time multiplexed for different tests performed. For example, time segment 1 is reserved for dielectric breakdown, time segment 2 for BTI, and time segment 3 for HCI degradation. In some embodiments, one or more circuits are shut down (i.e., prevented from switching) if the controller identifies that one or more reliability conditions have not been met in view of the tested one or more ring oscillators.

The operating system 770 may include components that enable the controller 700 to receive and transmit data via various interfaces (e.g., user controls, communication interface, and/or memory input/output devices), as well as process data using the processors 708 to generate output. The operating system 750 may include a presentation component that presents the output (e.g., display the data on an electronic display of the controller 700, store the data in memory 750, transmit the data to another electronic device, etc.). Additionally, the operating system 770 may include other components that perform various additional functions generally associated with an operating system 770.

Example Processes

Figure 8:
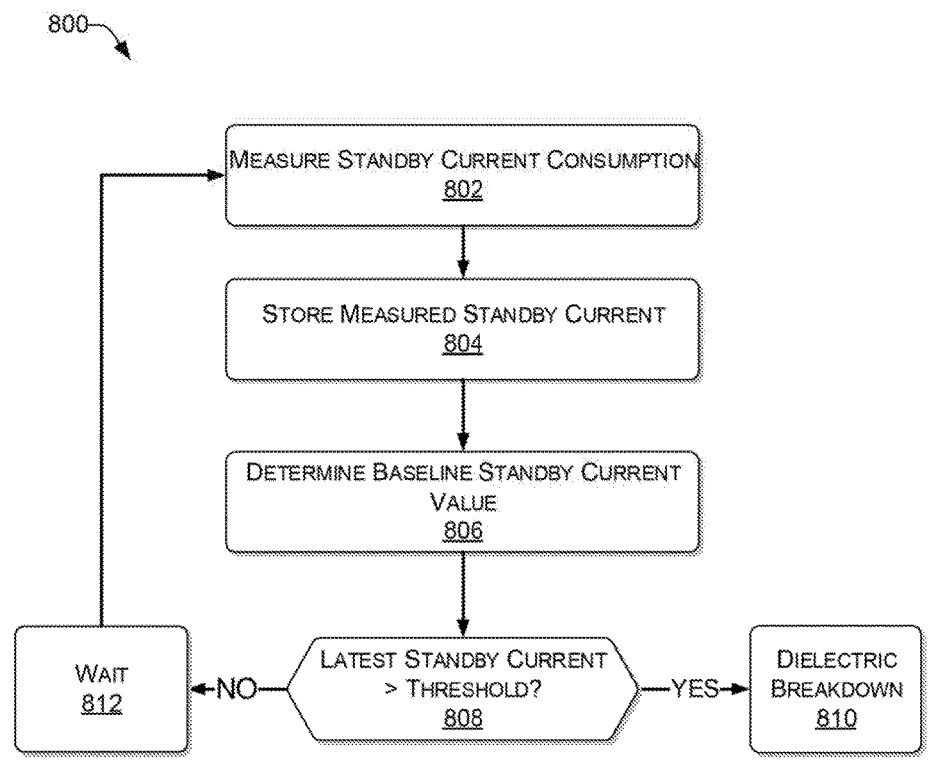
FIG. 8 describes an example process to determine whether there is a dielectric breakdown degradation concern.
Figure 9:
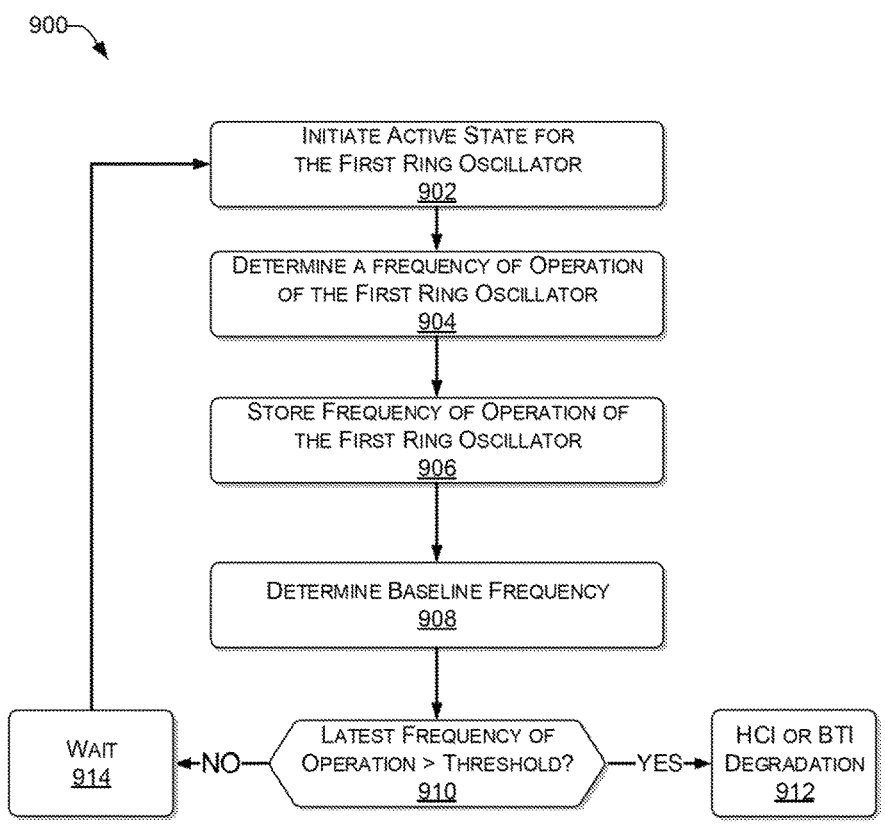
FIG. 9 describes an example process to determine whether there is hot carrier injection or bias temperature instability degradation concern, consistent with an illustrative embodiment.
Figure 10:
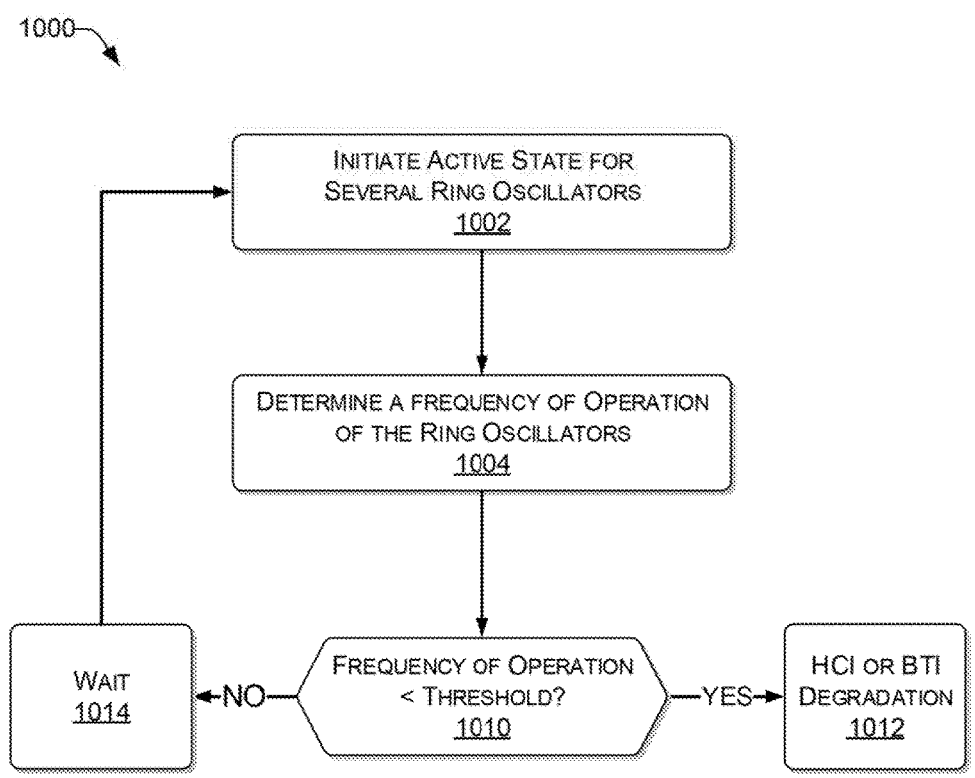
FIG. 10 describes an example process to determine whether there is hot carrier injection or bias temperature instability degradation concern, without determining a baseline based on historic measurements, consistent with an illustrative embodiment.

With the foregoing overview of the systems 500 and 600 and discussion of an example controller 700, it may be helpful now to consider a high-level discussion of example processes. To that end, FIGS. 8 to 10 present illustrative processes 800 to 1000 for various aspects of determining the reliability of a semiconductor device. Processes 800 to 1000 are illustrated as a collection of blocks in logical flowcharts, which represents a sequence of operations that can be implemented in hardware, software, or a combination thereof. In the context of software, the blocks represent computer-executable instructions that, when executed by one or more processors, perform the recited operations. Generally, computer-executable instructions may include routines, programs, objects, components, data structures, and the like that perform particular functions or implement particular abstract data types. The order in which the operations are described is not intended to be construed as a limitation, and any number of the described blocks can be combined in any order and/or performed in parallel to implement the process. For discussion purposes, the processes 800 to 1000 are described with reference to system 600 of FIG. 6.

FIG. 8 describes an example process to determine whether there is a dielectric breakdown degradation concern. At block 802, the leakage current consumption of the first ring oscillator 502 is measured and provided to the controller 606. This leakage current is measured while the first ring oscillator is in its default state, namely static and subject to a reference voltage Vdd, which acts as a stress voltage to the transistors of the static first ring oscillator.

At block 804, the measured standby current of the first ring oscillator 502 is stored in a memory, which may be a memory of the controller 606, or any other suitable memory.

At block 806, the controller 606 attempts to determine a baseline standby current value based on the available individual stored standby current values. It will be understood that initially, at the beginning stages of the iterative process described herein, there may not be enough values stored in the memory to have an identifiable baseline. The baseline becomes more accurate with each iteration.

At block 808, the controller compares a latest measured current consumption value of the first ring oscillator to the baseline to determine whether the leakage current is above a predetermined threshold deviation from the baseline. If so (i.e., "YES" at decision block 808), the first ring oscillator is identified to have dielectric breakdown degradation. Consequently, in one embodiment, one or more alerts may be generated to indicate that the first ring oscillator is not reliable in view of the dielectric breakdown concern. It will be understood that the first ring oscillator 502 may be a test structure to represent the reliability of another circuit. In some embodiments, the circuits that are associated with the first ring oscillator may be shut down (e.g., prevented from switching or having its power removed from the corresponding circuit blocks).

However, if the latest leakage current is not above the predetermined threshold deviation from the baseline, (i.e., "NO" at decision block 808), then the iterative process returns to block 802 after a wait period 812. The wait period may be periodic or may be based on a trigger event.

FIG. 9 describes an example process 900 to determine whether there is an HCI or BTI degradation concern, consistent with an illustrative embodiment. Process 900 may be performed before process 800 or thereafter (e.g., after block 808). At block 902, the controller 606 initiates an active state of the first ring oscillator 502.

At block 904, the frequency of oscillation of the first ring oscillator is determined. This frequency represents a frequency of a typically static ring oscillator that was exposed to a reference Vdd voltage when in standby.

At block 906, the measured frequency of the first ring oscillator 502 is stored in a memory, which may be a memory of the controller 606 or any other suitable memory.

At block 908, the controller 606 attempts to determine a baseline frequency value based on the available individual stored frequency values for the first ring oscillator. It will be understood that initially (e.g., at the beginning stages of the iterative process described herein), there may not be enough frequency measurement values stored in the memory to have an identifiable baseline for a frequency. The baseline becomes more accurate with each iteration.

At block 910, the controller compares a latest measured frequency value of the first ring oscillator to the baseline to determine whether the former value is below a predetermined threshold deviation from the baseline. If so (i.e., "YES" at decision block 910), the first ring oscillator is identified to have BTI and HCI breakdown. Consequently, appropriate alerts and precautionary measures may be taken, as discussed previously.

However, if the latest frequency measurement is not below the predetermined threshold deviation from the baseline, (i.e., "NO" at decision block 910), then the iterative process returns to block 902 after a wait period 914. The wait period may be a predetermined interval or may be based on a trigger event.

In one embodiment (e.g., where the process 900 is run after process 800), then the wait period 914 is identical to block 812 of process 800, and the combined process of 800 and 900 continues with block 802 after one wait period 812.

Reference now is made to FIG. 10, which describes an example process 1000 to determine whether there is an HCI or BTI degradation concern, without creating a baseline based on historic measurements, consistent with an illustrative embodiment. Process 1000 may be performed instead of process 900 described above.

At block 1002, the controller 606 initiates an active state of the first ring oscillator 502 and the second ring oscillator 522. In various embodiments, the active state of these two ring oscillators may be performed concurrently or in series.

At block 1004, the frequency of oscillation of the first and second ring oscillator is determined. In one embodiment, the frequency of oscillation of the third ring oscillator 632 is determined instead of or in addition to the second ring oscillator 522. This frequency of the first ring oscillator 502 represents a frequency of a typically static ring oscillator that was exposed to a reference Vdd stress voltage when in standby. The frequency of the second ring oscillator 522 represents a frequency of a typically static ring oscillator that was not exposed to a reference Vdd stress voltage when in standby. The frequency of the third ring oscillator 632 represents a frequency of a free running oscillator that is typically exposed to a reference Vdd stress voltage.

At block 1010, the measured frequency of the first ring oscillator 502 is compared to that of the second ring oscillator 522. In one embodiment, the frequency of the first ring oscillator 502 is compared to that of the third ring oscillator 632. A comparison of the frequency of the first ring oscillator 502 to the second ring oscillator 522 reveals DC degradation of the first ring oscillator 502, whereas a comparison to the third ring oscillator 632 reveals AC degradation of the third ring oscillator 632.

When comparing the frequency of the first ring oscillator 502 to the second ring oscillator 522, upon determining that the frequency of oscillation of the first ring oscillator is below a threshold variation from the second ring oscillator (i.e., "YES" at decision block 1010), the controller identifies the first ring oscillator to have a DC BTI and HCI degradation. However, if the frequency of oscillation of the first ring oscillator 502 is not below the threshold variation from the second ring oscillator 522 (i.e., "NO" at decision block 1010), the controller identifies the first ring oscillator not to have a DC BTI and HCI degradation and the iterative process continues after a wait period 1014, similar to that of process 900.

When comparing the frequency of the first ring oscillator 502 to the third ring oscillator 632, upon determining that the frequency of oscillation of the first ring oscillator 502 is above a predetermined threshold variation of the frequency of the third ring oscillator 632, the third ring oscillator 632 is identified to be subject to AC BTI and HCI degradation. If not (i.e., "NO" at decision block 1010), the controller identifies the third ring oscillator 632 not to have an AC BTI and HCI degradation, and the process continues after a wait period 1014, as discussed above.

CONCLUSION

The descriptions of the various embodiments of the present teachings have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

While the foregoing has described what are considered to be the best state and/or other examples, it is understood that various modifications may be made therein and that the subject matter disclosed herein may be implemented in various forms and examples, and that the teachings may be applied in numerous applications, only some of which have been described herein. It is intended by the following claims to claim any and all applications, modifications and variations that fall within the true scope of the present teachings.

The components, steps, features, objects, benefits and advantages that have been discussed herein are merely illustrative. None of them, nor the discussions relating to them, are intended to limit the scope of protection. While various advantages have been discussed herein, it will be understood that not all embodiments necessarily include all advantages. Unless otherwise stated, all measurements, values, ratings, positions, magnitudes, sizes, and other specifications that are set forth in this specification, including in the claims that follow, are approximate, not exact. They are intended to have a reasonable range that is consistent with the functions to which they relate and with what is customary in the art to which they pertain.

Numerous other embodiments are also contemplated. These include embodiments that have fewer, additional, and/or different components, steps, features, objects, benefits and advantages. These also include embodiments in which the components and/or steps are arranged and/or ordered differently. For example, any signal discussed herein may be scaled, buffered, scaled and buffered, converted to another state (e.g., voltage, current, charge, time, etc.), or converted to another state (e.g., from HIGH to LOW and LOW to HIGH) without materially changing the underlying control method.

While NFETS and PFETS are illustrated in some of the examples herein, these transistors were provided by way of example only, and not by way of limitation. It will be understood, based on the concepts disclosed herein, that other types of insulated-gate field effect transistors (IGFET) with complementary logic may be used as well. For example, any FETS from columns III-V of the periodic table, including carbon nanotube FETS could be used as well to implement the structures described herein.

Aspects of the present disclosure are described herein with reference to flowchart illustrations and/or block diagrams of methods, apparatus (systems), and computer program products according to embodiments of the application. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

While the foregoing has been described in conjunction with exemplary embodiments, it is understood that the term "exemplary" is merely meant as an example, rather than the best or optimal. Except as stated immediately above, nothing that has been stated or illustrated is intended or should be interpreted to cause a dedication of any component, step, feature, object, benefit, advantage, or equivalent to the public, regardless of whether it is or is not recited in the claims.

It will be understood that the terms and expressions used herein have the ordinary meaning as is accorded to such terms and expressions with respect to their corresponding respective areas of inquiry and study except where specific meanings have otherwise been set forth herein. Relational terms such as first and second and the like may be used solely to distinguish one entity or action from another without necessarily requiring or implying any actual such relationship or order between such entities or actions. The terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus. An element proceeded by "a" or "an" does not, without further constraints, preclude the existence of additional identical elements in the process, method, article, or apparatus that comprises the element.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

What is claimed is:

1. A semiconductor reliability monitor comprising:
   a first ring oscillator maintained under a reference stress voltage while in a static state;
   a current sensor configured to measure a current consumption value of the first ring oscillator while the first ring oscillator is in the static state, wherein the current consumption measurement is performed at predetermined intervals; and
   a controller coupled to the first ring oscillator, wherein the controller is configured to:
      receive and store each measured current consumption value of the first ring oscillator while in the static state, in a memory;
      determine a baseline current consumption value of the first ring oscillator based on the stored current consumption values;
      compare a latest measured current consumption value of the first ring oscillator to the baseline current consumption value; and
      upon determining that the latest measured current consumption value is above a threshold deviation from the baseline current consumption value, identify the first ring oscillator to have a dielectric breakdown.

2. The semiconductor reliability monitor of claim 1, wherein:
   the first ring oscillator also has an active state that allows the first ring oscillator to oscillate; and
   the controller is further configured to keep the first ring oscillator in a default static state unless performing a frequency of oscillation measurement on the first ring oscillator.

3. The semiconductor reliability monitor of claim 1, wherein the controller is further configured to:
   activate an active state of the first ring oscillator;
   determine a frequency of oscillation of the first ring oscillator for a predetermined time period during the active state; and
   determine whether there is a BTI and HCI degradation based on the frequency of oscillation of the first ring oscillator.

4. The semiconductor reliability monitor of claim 3, wherein determining whether there is BTI degradation and HCI degradation comprises:
   comparing the frequency of oscillation of the first ring oscillator to a reference value; and upon determining that the frequency of oscillation is below a predetermined threshold of the reference value, identifying the first ring oscillator to have BTI and HCI degradation.

5. The semiconductor reliability monitor of claim 1, further comprising a second ring oscillator maintained without a reference stress voltage while in a static state.

6. The semiconductor reliability monitor of claim 5, wherein the controller is further configured to:
activate an active state of the first and second ring oscillators for a predetermined time period;
determine a frequency of oscillation of the first ring oscillator and the second ring oscillator during the predetermined time period; and
upon determining that the frequency of oscillation of the first ring oscillator is below a threshold variation from the second ring oscillator, identifying the first ring oscillator to have a BTI and HCI degradation.

7. The semiconductor reliability monitor of claim 6, wherein the frequency of oscillation of the first ring oscillator and the second ring oscillator are determined concurrently.

8. The semiconductor reliability monitor of claim 5, further comprising a third ring oscillator maintained in a free running state and at the reference stress voltage, wherein the controller is further configured to:
activate an active state of the second ring oscillator for a predetermined time period;
determine a frequency of oscillation of the second ring oscillator and the third ring oscillator, during the predetermined time period; and
upon determining that the frequency of oscillation of the third ring oscillator is below a threshold variation from the second ring oscillator, identifying the third ring oscillator to have a BTI and HCI degradation.

9. The semiconductor reliability monitor of claim 5, further comprising a third ring oscillator maintained in a free running state and at the reference voltage, wherein controller is further configured to:
activate an active state of the first ring oscillator for a predetermined time period;
determine a frequency of oscillation of the first ring oscillator and the third ring oscillator, during the predetermined time period; and
upon determining that the frequency of oscillation of the third ring oscillator is below a threshold variation from the first ring oscillator, identifying the third ring oscillator to have a BTI and HCI degradation.

10. The semiconductor reliability monitor of claim 5, wherein the controller is configured to activate the first and second oscillators at a same time and deactivate the first and second oscillators at a second same time.

11. A method of monitoring a degradation of a semiconductor circuit, comprising:
measuring a current consumption of a first ring oscillator in static state at predetermined intervals;
storing each measured current consumption value of the first ring oscillator in the static state;
determining a baseline current consumption value of the first ring oscillator based on the stored current consumption values;
comparing a latest measured current consumption value of the first ring oscillator to the baseline current consumption value; and
upon determining that the latest measured current consumption value is above a threshold deviation from the baseline current consumption value, identifying the first ring oscillator to have a dielectric breakdown.

12. The method of claim 11, wherein the first ring oscillator is maintained under a reference stress voltage while in a static state.

13. The method of claim 11, further comprising keeping the first ring oscillator in a default static state unless performing a frequency of oscillation measurement on the first ring oscillator.

14. The method of claim 11, further comprising:
activating an active state of the first ring oscillator;
determining a frequency of oscillation of the first ring oscillator for a predetermined time period during the active state; and
determining whether there is a BTI and HCI degradation based on the frequency of oscillation of the first ring oscillator.

15. The method of claim 14, wherein determining whether there is BTI and HCI degradation comprises:
comparing the frequency of oscillation of the first ring oscillator to a reference value; and
upon determining that the frequency of oscillation is below a predetermined threshold of the reference value, identifying the first ring oscillator to have BTI and HCI degradation.

16. The method of claim 11, further comprising maintaining a second ring oscillator without a reference stress voltage while in a static state.

17. The method of claim 16, further comprising:
activating an active state of the first and second ring oscillators for a predetermined time period;
determining a frequency of oscillation of the first ring oscillator and the second ring oscillator during the predetermined time period; and
upon determining that the frequency of oscillation of the first ring oscillator is below a threshold variation from the second ring oscillator, identifying the first ring oscillator to have a BTI and HCI degradation.

18. The method of claim 17, wherein the frequency of oscillation of the first ring oscillator and the second ring oscillator are determined concurrently.

19. The method of claim 16, further comprising:
maintaining a third ring oscillator in a free running state and at the reference stress voltage;
activating an active state of the second ring oscillator for a predetermined time period;
determining a frequency of oscillation of the second ring oscillator and the third ring oscillator, during the predetermined time period; and
upon determining that the frequency of oscillation of the third ring oscillator is below a threshold variation from the second ring oscillator, identifying the third ring oscillator to have a BTI and HCI degradation.

20. The method of claim 16, further comprising:
maintaining a third ring oscillator maintained in a free running state and at the reference voltage;
activating an active state of the first ring oscillator for a predetermined time period;
determining a frequency of oscillation of the first ring oscillator and the third ring oscillator, during the predetermined time period; and
upon determining that the frequency of oscillation of the third ring oscillator is below a threshold variation from the first ring oscillator, identifying the third ring oscillator to have a BTI and HCI degradation.

* * * * *